United States Patent [19]

Tedeschi et al.

[11] 4,291,383

[45] Sep. 22, 1981

[54] SPARK PLUG LOAD TESTING FOR AN INTERNAL COMBUSTION ENGINE

[75] Inventors: Rinaldo R. Tedeschi, Newington; Gary G. Full, Ellington, both of Conn.

[73] Assignee: United Technologies Corporation, Hartford, Conn.

[21] Appl. No.: 105,680

[22] Filed: Dec. 20, 1979

[51] Int. Cl.$^3$ .................... G01R 21/00; G06F 15/20; G01M 15/00

[52] U.S. Cl. .................................. 364/551; 73/117.2; 364/483; 324/384

[58] Field of Search .................... 73/116, 117.2, 117.3; 364/551; 324/380-384

[56] References Cited

U.S. PATENT DOCUMENTS

| | | | |
|---|---|---|---|
| 4,006,403 | 2/1977 | Olsen et al. | 73/116 X |
| 4,125,894 | 11/1978 | Cashel et al. | 73/117.2 X |
| 4,145,746 | 3/1979 | Trussell et al. | 73/117.3 X |
| 4,170,131 | 10/1979 | Gniewek et al. | 364/551 X |
| 4,179,922 | 12/1979 | Bouverie et al. | 364/551 X |

*Primary Examiner*—Felix D. Gruber
*Attorney, Agent, or Firm*—Dominic J. Chiantera

[57] ABSTRACT

The spark voltage waveform at the secondary of the ignition coil of an internal combustion (IC) engine is sensed over a plurality of successive engine cycles. The instantaneous sub-cyclic position of the engine crankshaft is measured at successive crankshaft angle increments within each engine cycle and each sensed spark voltage signal is identified by the instantaneous value of crankshaft position at which it appears, thereby providing identification of each spark voltage signal with an associated cylinder of the engine. The number of samples for each cylinder together with the peak KV voltage magnitude and time duration of each are measured and the maximum, minimum and mean values of peak KV and spark duration for the spark signals associated with each cylinder together with the number of samples obtained are compared with the values obtained for each other cylinder to provide an indication of the relative sub-cyclic ignition efficiency of the ignition secondary circuit and the individual cylinders.

5 Claims, 11 Drawing Figures

SPARK PLUG LOAD TESTING FOR AN INTERNAL COMBUSTION ENGINE

DESCRIPTION

Technical Field

This invention relates to the extra-vehicular hot-testing of internal combustion (IC) engines, and more particularly to diagnosing hot-test engine performance electronically.

BACKGROUND ART

Hot-testing of IC engines outside of a vehicle (extra-vehicular) is known generally, being used mainly in the testing of newly manufactured, production line engines and in the testing of overhauled or repaired engines. The term hot-test refers to testing the engine with ignition to determine basic dynamic engine performance. At present, the actual tests performed during the engine hot-test involve the most basic test criteria and rely almost entirely on the hot-test operation for diagnosing base-line engine performance. Although the tests may involve measurement of basic engine timing, in general the pass/fail acceptance standards are based on what the operator perceives of the engine running characteristics, such as the inability to start or to maintain engine speed, or the sound of the engine while running. These tests do provide suitable pass/fail criteria for gross engine malfunctions, however, it is impossible, except to the most experienced operator, to provide even simple diagnosis of the cause of the engine poor performance.

In the first instance, the inability to provide quantitative measurements of engine performance and acceptance, results in the acceptance of marginal engines in which the actual failure occurs sometime later as an infant mortality, perhaps after installation in the vehicle. Conversely, the rejection of an engine based on the present qualitative standards may be unwarranted in many instances, resulting in the unnecessary recycling of the engine through some type of repair facility, where with more extensive testing the apparent fault may be corrected with a minor engine adjustment. Therefore, it is desirable to establish an accurate quantitative analysis testing procedure which with measurement of selected engine parameters may provide for accurate pass/fail determination.

In general, the present state of the art of IC engine diagnostics includes the use of a number of different measurable engine parameters which in one way or other are useful in providing information as to engine performance. One such parameter is sparkplug voltage which provides an indication of the performance of the engine's secondary ignition circuit in addition to particular cylinder ignition faults. At present, however, measurements of sparkplug voltage signals are provided on a single cylinder one-at-a-time basis, such that each cylinder's spark waveform is measured individually and compared with acceptable tolerances for peak KV amplitude and spark duration. Identification of measured spark signal with the associated cylinder is provided either by direct measurement of the spark signal at the cylinder sparkplug, or if sensed at the secondary of the engine ingition coil, by synchronization of the spark sample with an engine timing event. In either case measurements are provided on an individual basis without benefit of comparison of a particular cylinder's spark waveform with the spark signals provided to the remaining cylinders within the same engine cycle. Since the existence of an ignition fault in one cylinder may affect, to one extent or another, the sparkplug voltage signal provided to one or more other cylinders it is preferred to compare each of the cylinder spark signals with the others occurring within the same engine cycle. This permits the measurement of the relative performance of each cylinder in comparison with the remaining cylinders under simultaneously equal test conditions.

Similarly, the present methods of measuring each cylinder's spark signal makes it difficult to detect intermittent firing of a given cylinder since the spark signal measurement is provided as an average of the cylinder's spark signal over recurring engine cycles. By providing for the detection of intermittent spark, or the indication of relative ignition efficiency of each cylinder within each of a number of engine cycles, both present and imminent ignition system faults may be detected.

CROSS-REFERENCE TO RELATED APPLICATIONS

Some of the subject matter disclosed and claimed herein is also disclosed in one or more of the following commonly owned, copending U.S. patent applications filed on even date herewith by: Full et al, Ser. No. 105,803, entitled RELATIVE MANIFOLD VACUUM OF AN INTERNAL COMBUSTION ENGINE; Full et al, Ser. No. 105,446, entitled RELATIVE EXHAUST BACK-PRESSURE OF AN INTERNAL COMBUSTION ENGINE; Tedeschi et al, Ser. No. 105,448, entitled SNAP ACCELERATION TEST FOR AN INTERNAL COMBUSTION ENGINE; and Full et al, Ser. No. 105,447, entitled RELATIVE POWER CONTRIBUTION OF AN INTERNAL COMBUSTION ENGINE.

DISCLOSURE OF INVENTION

The object of the present invention is to provide an indication of the sub-cyclic, relative spark efficiency of the secondary ignition circuitry of an IC engine. Another object of the present invention is to provide for detection of intermittent ignition faults as may occur on an aperiodic, sub-cyclic basis.

According to the present invention, a position sensor provides signals indicative of the instantaneous sub-cyclic position of the engine crankshaft at successive crankshaft angle increments within each engine cycle by monitoring selected indicia of a member of the engine/load combination which rotates with the engine crankshaft, each angle increment being substantially smaller than that associated with a cylinder sub-cycle, and the presence of each spark voltage signal at the secondary of the engine ignition coil is sensed and identified by the instantaneous value of crankshaft position at which it appears, thereby providing identification of each spark voltage signal with an associated one of the engine cylinders in each of a plurality of successive engine cycles. In further accord with the present invention, a reference synchronization point is provided in each cam cycle by a crankshaft index sensor which detects the occurrence of an engine cycle event which occurs at a known angle position in each engine cycle, the engine cylinder's TDC position in each cylinder power stroke being identified with respect to the synchronization point, each sensed spark voltage signal being identified with a particular engine cylinder by comparison of the sensed angle at which the signal appears to the anticipated TDC position of each cylinder with respect to the synchronization point, the peak KV voltage magnitude and spark duration being sensed and compared with each other in each engine cycle to provide an indication of the subcyclic, relative ignition efficiency of each cylinder. In still further accord with the present invention, the spark voltage signals associated with each cylinder are sensed in each of a plurality of successive engine cycles and the absence of a spark in any cycle is identified by the associated cylinder together with the minimum, maximum and mean values of peak KV and spark duration obtained for each cylinder over the plurality of engine cycles, thereby providing an indication of the presence and relative cycle-to-cycle efficiency of each cylinder spark signal.

The sparkplug load test of the present invention allows for the indication of the relative ignition performance of both the engine's ignition secondary and also the instantaneous relative performance of each cylinder's ignition on a sub-cyclic basis, within each of a plurality of succesive engine cycles.

These and other objects, features and advantages of the present invention will become more apparent in light of the detailed description of a best mode embodiment thereof, as illustrated in the accompanying drawing.

BEST MODE FOR CARRYING OUT THE INVENTION

Figure 1:
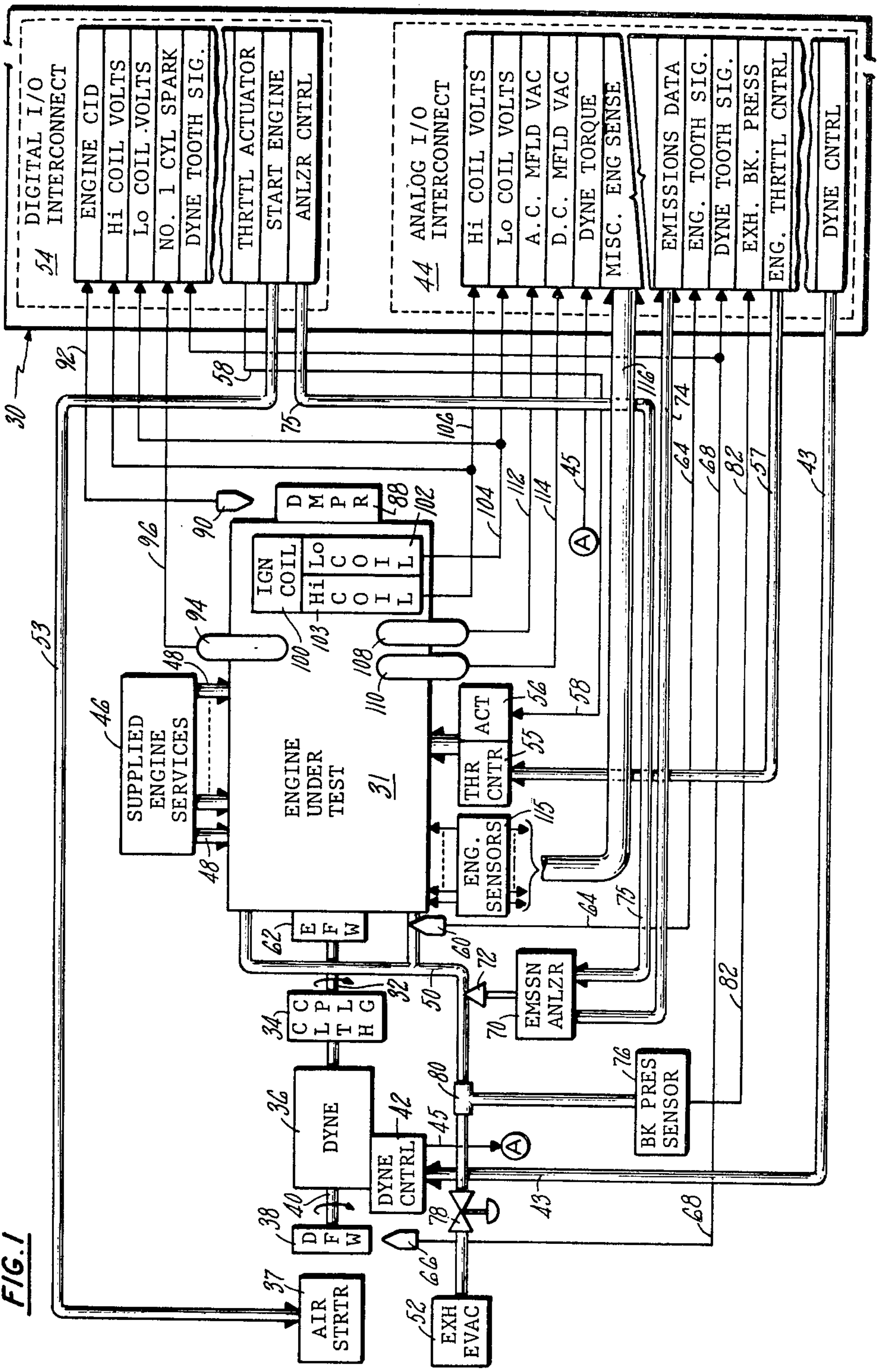
FIG. 1 is a schematic block diagram illustration of the instrumentation in a typical engine hot-test installation in which the present invention may be used.

Referring to FIG. 1, in a simplified illustration of an engine hot-test installation in which the present invention may be used, a test control system 30 receives sensed engine data from the test engine 31 which is mounted in a test stand (not shown) and loaded by connection of the engine crankshaft 32 through a coupling assembly 34 to an engine load, such as a brake mechanism or, as illustrated, a dynamometer (dyne) load 36. The dyne is known type, such as the Go-Power Systems model D357 water dynamometer, equipped with an air starter 37. The air starter is used to crank the test engine (through the dyne) in the absence of an engine mounted starter. A dyne flywheel 38, connected to the dyne shaft 40, includes a ring-gear (not shown) having a selected number of precision machined gear teeth equally spaced around the circumference of the ring-gear so that the tooth-to-tooth intervals define substantially equal increments of dyne shaft angle. Dyne control circuitry 42 controls the dyne load torque (Ft-Lb) to a set point torque reference signal provided on lines 43 from the analog interconnect 44 of the control system 30, by controlling the amount of water in the dyne drum (not illustrated in FIG. 1). The dyne control circuitry also provides a sensed, actual dyne torque signal on a line 45 to the analog interconnect of the control system.

The test engine is provided with the engine services 46 necessary for engine operation, such as fuel, oil, and water, etc. through service connections 48. The engine exhaust manifolds are connected through exhaust line 50 to an exhaust evacuating pump 52. Following engine start-up in response to a "start engine" discrete signal presented on lines 53 to the starter 37 (or engine starter if available) from the control system digital interconnect 54, an engine throttle control 55 and associated throttle control actuator 56 control the engine speed (RPM) to an engine RPM reference set point signal provided to the control on lines 57 from the analog interconnect. In addition, the actuator receives a discrete signal from the digital interconnect 54 on a line 58, which is used to provide snap acceleration of the engine as described hereinafter. In summary, the test engine under hot-test is operated under controlled load at selected engine speed profiles to permit the dynamic analysis of the engine base-line parameters and the engine diagnostic routines described hereinafter.

The hot-test sequence examines engine base-line parameters related to speed, exhaust emissions, ignition cycle timing, and spark duration to determine engine health, i.e., output power and combustion efficiency. The speed measurements include engine crankshaft speed (RPM) and dyne shaft speed. The indication of engine crankshaft speed may be provided by any type of rotational speed sensing device, such as a shaft encoder, or preferably a magnetic pick-up sensor 60, such as Electro Corp. RGT model 3010-AN Magnetic Proximity Sensor, which senses the passage of the teeth of the engine ring-gear mounted on the engine flywheel 62 and provides an engine series tooth pulse signal on the line 64 to the analog interconnect. The actual number of ring-gear teeth depends on the particular engine model with 128 teeth being average. The teeth are uniformly spaced around the circumference of the ring gear, such that 128 teeth provide tooth-to-tooth spacing corresponding to a crankshaft angle interval of 2.813 degrees. This is adequate for marking subcyclic cylinder events within the ignition cycle, but due to the variation of total tooth count with different engine models it may be preferred to provide the crankshaft angle resolution required by the control system from the load speed indication. The load speed may also be sensed with a shaft encoder or by sensing the teeth of the dyne ring-gear which has a tooth count typically twice that of the engine ring-gear, or 256 teeth for the 128-tooth engine ring-gear. This is provided by a proximity sensor 66, similar to the sensor 60, which senses the passage of the dyne ring-gear teeth to provide a dyne series tooth pulse signal on line 68 to the analog interconnect. The precision edging of the dyne teeth allows for exact resolution on the leading and trailing edges of each of the tooth pulse signals which permits (as described in detail hereinafter) edge detection of each to provide an equivalent 512 dyne tooth intervals per crankshaft revolution.

Engine exhaust measurements include both exhaust gas analysis and exhaust back-pressure measurements. The emissions analysis measures the hydrocarbon (HC) and carbon monoxide (CO) constituents of the exhaust with an emissions analyzer 70, of a type known in the art such as the Beckman model 864 infrared analyzer. The analyzer is connected to the exhaust pipe 50 through an emissions probe 72. The HC and CO concentration is determined by the differential measurement of the absorption of infrared energy in the exhaust gas sample. Specifically, within the analyzer two equal energy infrared beams are directed through two optical calls; a flow through exhaust gas sample cell and a sealed reference cell. The analyzer measures the difference between the amounts of infrared energy absorbed in the two cells and provides, through lines 74 to the control system analog interconnect, HC and CO concentrations as DC signals with full scale corresponding typically to: (1) a full-scale HC reading of 1000 PM, and (2) a full-scale CO of 10%. The analyzer operating modes are controlled by control signal discretes provided on lines 75 from the digital interconnect. The exhaust back-pressure instrumentation includes a back-pressure sensor 76, such as a Viatran model 21815 with a range of ±5 PSIG, and a back-pressure valve 78, such as a Pacific Valve Co. model 8-8552. The pressure sensor is connected to the exhaust line 50 with a tap joint 80 and provides a signal indicative of exhaust back-pressure on line 82 to the analog interconnect. The back-pressure valve simulates the exhaust system load normally provided by the engine muffler and is typically a manually adjustable 2" gate valve with a range of 15 turns between full open and full closed.

The engine ignition timing information is derived from the crankshaft angle information provided by the dyne and engine ring-gear teeth and by sensing a crankshaft index (CI), such as the timing marker on the engine damper 88. The CI is sensed with a magnetic pick-up sensor 90, such as the Electro Corp. Model 4947 proximity switch, which preferably is mounted through a hole provided on the damper housing and measures the passage of the timing marker notch on the damper. The sensor mounting hole is at a known crankshaft angle value from the top dead center (TDC) position of the #1 cylinder, and is determined from the engine specifications. The notch triggers a signal pulse by passing near the CI sensor every crankshaft revolution and the CI pulses are provided on lines 92 to the control system digital interconnect. In addition, the ignition cycle information includes measurement of the #1 cylinder sparkplug firing which in combination with the CI sensor indication provides a crankshaft synchronization point corresponding to the TDC of the #1 cylinder power stroke. The spark firing is sensed by a clamp-on Hall effect sensor 94 which provides a voltage signal pulse coincident with the sparkplug firing on a line 96 to the digital interconnect.

The sparkplug signal duration measurements are provided by measuring the primary (Lo Coil) and secondary (Hi Coil) voltage signals of the engine ignition coil 100. The Lo Coil voltage is sensed by a connection 102 to the primary of the coil and the Hi Coil voltage is measured with a sensor 103, such as a Tektronix Model P6015 high-voltage probe with a range of 0 to 50 KV. The signals are provided on lines 104, 106 to both interconnects of the control system.

In addition to sensing engine speed, exhaust, ignition timing and spark duration parameters, the intake manifold vacuum pressure is also sensed. Two vacuum measurements are made; a DC manifold vacuum which provides the average vacuum level, and an AC manifold vacuum which provides instantaneous values of vacuum. The AC measurements are made by inserting a pressure sensor 108, such as a VIATRAN Model 218 with a range of ±1 PSIG, in the engine vacuum line connected to the PCV valve. The DC manifold vacuum sensor 110 may be a VIATRAN Model 218 with a range of ±15 PSIG inserted in the same vacuum line. Each sensor provides a voltage signal indicative of the sensed pressure on lines 112, 114 to the control system. Additional engine sensors 115, such as pressure and temperature of the engine oil, fuel, water, etc. are provided to the control system through lines 116. The sensors provide the information on the necessary prerequisite engine ambient conditions which must be established prior to test, as discussed in detail hereinafter.

Figure 2:
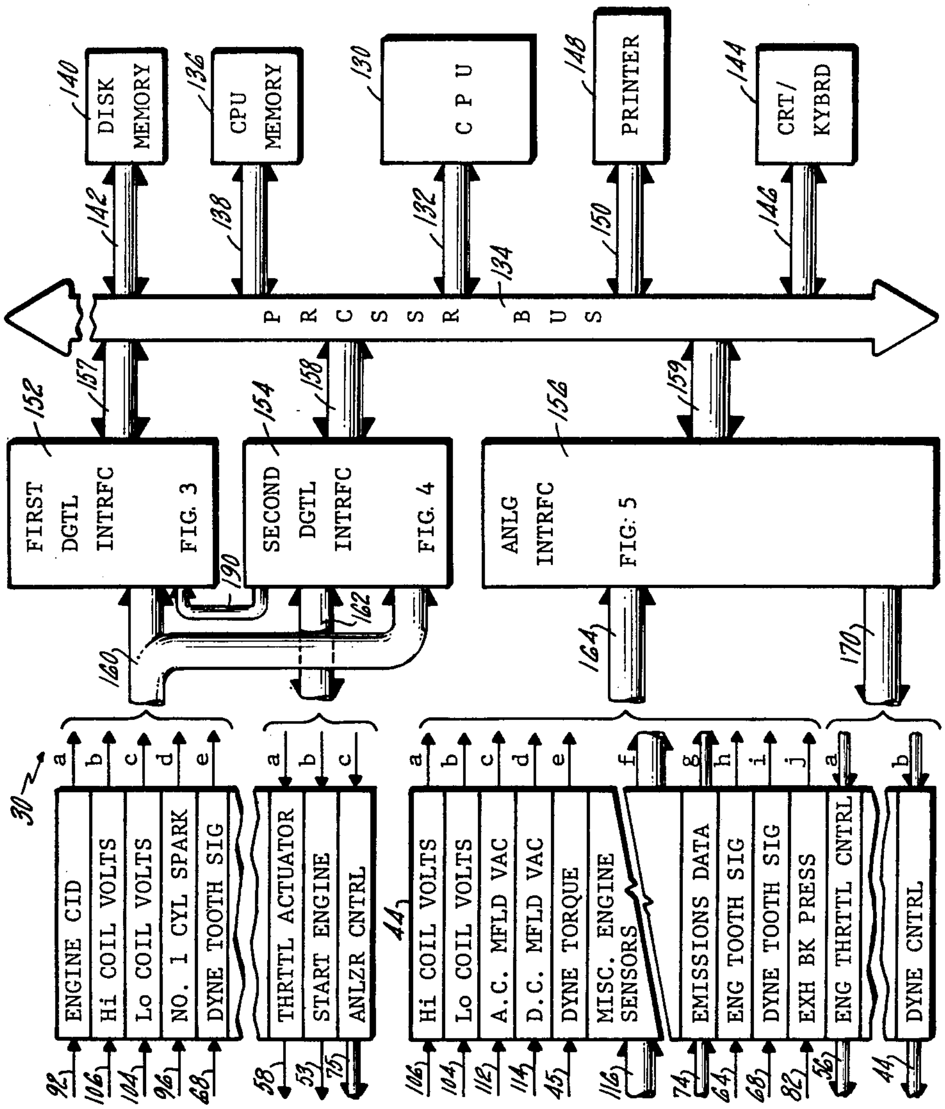
FIG. 2 is a system block diagram of a hot-test control system which may incorporate the present invention.

With the test engine connected to the load dyne 36 and instrumented as shown in FIG. 1, the hot-test control system automatically programs the start-up (cranking), ignition, and running of the engine at prescribed engine speed (RPM) and engine load conditions. Referring now to FIG. 2, a hot-test control system 30 which may incorporate the present invention includes a central processing unit (CPU) 130 which preferably is a known, proprietary model generator purpose computer, such as the Digital Equipment Corporation (DEC) Model PDP-11/34 minicomputer which may be used with a software data system based on the DEC RSX11-M multi-task real time software package. The size of the CPU depends on the data processing tasks of the system, so that depending on the hot-test system requirements, a smaller microcomputer, such as the DEC LSI-11, may be used for the CPU. Similarly, a number of smaller CPUs may be used, each dedicated to a particular aspect or function of the system. The selection of the particular type of CPU to be used is one which may be made by those skilled in the art, based on system through-put requirements. It should be understood, however, that selection of the particular type of CPU is dependent on overall hot-test requirements alone, and forms no part of the present invention. If it is considered necessary, or practical, any one of a number of known processing systems and software packages may be used as may be obvious or readily apparent to those skilled in the art.

As known, the CPU includes general purpose registers that perform a variety of functions and serve as accumulators, index registers, etc. with two dedicated for use as a stack pointer (the locations, or address of the last entry in the stack or memory) and a program counter which is used for addressing purposes and which always contains the address of the next instruction to be executed by the CPU. The register operations are internal to the CPU and do not require bus cycles. The CPU also includes: an arithmetic logic unit (ALU), a control logic unit, a processor status register, and a read only memory (ROM) that holds the CPU source code, diagnostic routines for verifying CPU operation, and boothstrap loader programs for starting up the system. The CPU is connected through input/output (I/O) lines 132 to a processor data bus 134 which includes both control lines and data/address lines and functions as the interface between the CPU, the associated memory 136 which is connected through I/O lines 138 to the data bus, and the peripheral devices including user equipment.

The memory 136 is typically nonvolatile, and may be either a core memory, or preferably a metallic oxide semiconductor (MOS) memory with battery backup to maintain MOS memory contents during power interruption. The MOS memory may comprise one or more basic MOS memory units, such as the DEC MOS memory unit MS11-JP each having 16 K words of memory location, as determined by system requirements. The memory is partitioned into several areas by the system application software, as described hereinafter, to provide both read only, and read/write capability.

The peripheral devices used with the CPU and memory, other than the user interface devices, may include: (1) a disk memory loader 140, such as a DEC Pac Disk Control unit with two disk drives, connected through I/O lines 142 to the bus, (2) a CRT/keyboard terminal 144, such as DEC ADDS model 980, connected through I/O lines 146 to the bus, and (3) a printer 148, such as the DEC LA 35 printer, connected through I/O lines 150. The printer and disk loader are options, the disk memory loader being used to store bulk engine data or specific test routine instructions on floppy disks, which may then be fetched by the CPU. Alternatively, the specific test routines may be stored in the memory 136 such that the disk memory loader is used to store only bulk data.

The CRT/keyboard unit provides man-machine interface with the control system which allows an operator to input information into, or retrieve information from the system. These man-machine programs may include general command functions used to start, stop, hold, or clear various test routines, or to alter engine speed or dyne torque set point values for the engine throttle and dyne control circuitry. In addition, a specific "log-on" procedure allows the operator to alter the engine specification data stored in a data common portion of the memory 136.

The user interfaces include first and second digital interfaces 152, 154, and analog interface 156, connected through I/O lines 157–159 to the processor bus. Each digital interface receives the sensed engine data from the digital I/O interconnect 54 on lines 160. The digital interface 154 provides the required control system output discrete signals to the test engine instrumentation through lines 162 to the digital I/O interconnect. The sensed engine data presented to the analog I/O interconnect 44 is presented through lines 164 to the analog interface which provides the control system set point reference signals for the engine throttle and dyne control circuitry on lines 170 back to the analog interconnect.

In the operation of the CPU 130 and memory 136 under the application software for the system, the memory is partitioned into a number of different areas, each related to a different functional aspect of the application software. As used here, the term application software refers to the general structure and collection of a coordinated set of software routines whose primary purpose is the managament of system resources for control of, and assistance to, the independently executable test programs described individually hereinafter. The three major areas of the memory include: (1) a library area for storing a collection of commonly used subroutines, (2) a data common area which functions as a scratch pad and which is accessible by other programs in memory which require scratchpad storage, and (3) a general data acquisition program area which includes routines for: collecting raw data from the user interfaces and storing the raw data in data common, deriving scaled, floating point data from the raw data, and a safety monitor subroutine which monitors some of the incoming data for abnormal engine conditions such as engine overspeed, low oil pressure, and excessive engine block temperature. In addition to the three main program areas, a further partition may be provided for a test sequencer program which functions as a supervisory control of the engine hot-test sequence of operations.

The data common area is partitioned into sub-regions for: (1) storing the sensed raw data from the user interfaces, (2) storing scaled data derived from the stored sensed data by use of selected conversion coefficients, (3) storing engine model specifications such as number of cylinders, firing order, CI sensor mounting hole angle, number of ring-gear teeth, etc., and (4) storing a description of the desired test plan (a list of test numbers).

The areas in memory dedicated to the various test plans stored in data common (4) include a test module partition in which the engine tests requested by the test sequencer program are stored during execution of the test. The tests stored represent separately built program test routines executed during hot-test, that have a name format "TSTXXX" where XXX is a three-digit number. The test routines themselves are stored either in a further partition of the memory 136 or, if optioned, stored on floppy disks and read into the test module partition from the disk driver.

Each CPU instruction involves one or more bus cycles in which the CPU fetches an instruction or data from the memory 136 at the location addressed by the program counter. The arithmetic operations performed by the ALU can be performed from: one general register to another which involves operations internal to the CPU and do not require bus cycles (except for instruction fetch), or from one memory location or peripheral device to another, or between memory locations of a peripheral device register and a CPU general register; all of which require some number of bus cycles.

In the control system embodiment of FIG. 2, a combination interrupt/noninterrupt mode of operation is selected, although if desired, total noninterrupt may be used with further dedicated programming. The digital interfaces 152, 154 establish the processor interrupt mode of operation in which the CPU reads particular sensed engine data from the analog interface in response to specific events occurring within each engine cycle. The interrupt mode includes several submodes in which the CPU is directed to read specific input parameters, or combinations of parameters, depending upon the selected test. Each of the interrupts have an associated vectored address which directs the CPU to the particular input channels, or the locations in memory associated with the particular analog channel. These vectored interrupts are used to cause the CPU to read at the particular selected interrupt time: (a) engine cam angle alone, (b) cam angle and one or more analog channels, (c) one or more analog channels without cam angle, and (d) the spark duration counter (described hereinafter with respect to FIG. 4). In the absence of interrupts, i.e., the noninterrupt mode of operation, the CPU reads the data provided at the analog interface continuously as a stand alone device. In this noninterrupt mode, the sample sequence and sample time interval, typically one second, is ordered by the general data acquisition routine which stores the raw data in the memory data common location.

The interface 152 provides the interrupts required to synchronize the CPU data acquisition to specific, selected events within the engine cycle. This is provided by synchronizing the CPU interrupts to crankshaft angle position by: (1) sensing instantaneous crankshaft angle position from the dyne tooth signal information, and (2) detecting the crankshaft synchronization point (the TDC of the #1 cylinder power stroke) by sensing the CI signal from the CI sensor (90, FIG. 1) together with the number one cylinder firing as provided by the spark sensor (94, FIG. 1), as described hereinafter. With the crankshaft index marking the beginning of each engine cycle, the dyne tooth signal provides information on the instantaneous crankshaft angle position from this crankshaft synchronization point, such that the entire ignition cycle may be mapped. As a result, cam cycle and subcyclic information related to specific cylinder events within the ignition cycle may be accurately tagged as corresponding to known crankshaft angle displacement from the synchronization point. The interface 152 then interrupts the processor at predetermined locations within the engine cycle, each identified by a particular crankshaft angle value stored in the memory 136 and associated with a particular engine cycle event. In addition, the interface 152 also provides CPU interrupt for: (1) the presence of number one cylinder spark ignition pulse, (2) the rising edge of the Lo coil voltage signal (which indicates the availability of the KV voltage to fire the sparkplug), (3) the CI signal, and (4) a discrete SPARK DURATION DATA READY signal provided from the digital interface 154 (described hereinafter with respect to FIG. 4).

Figure 3:
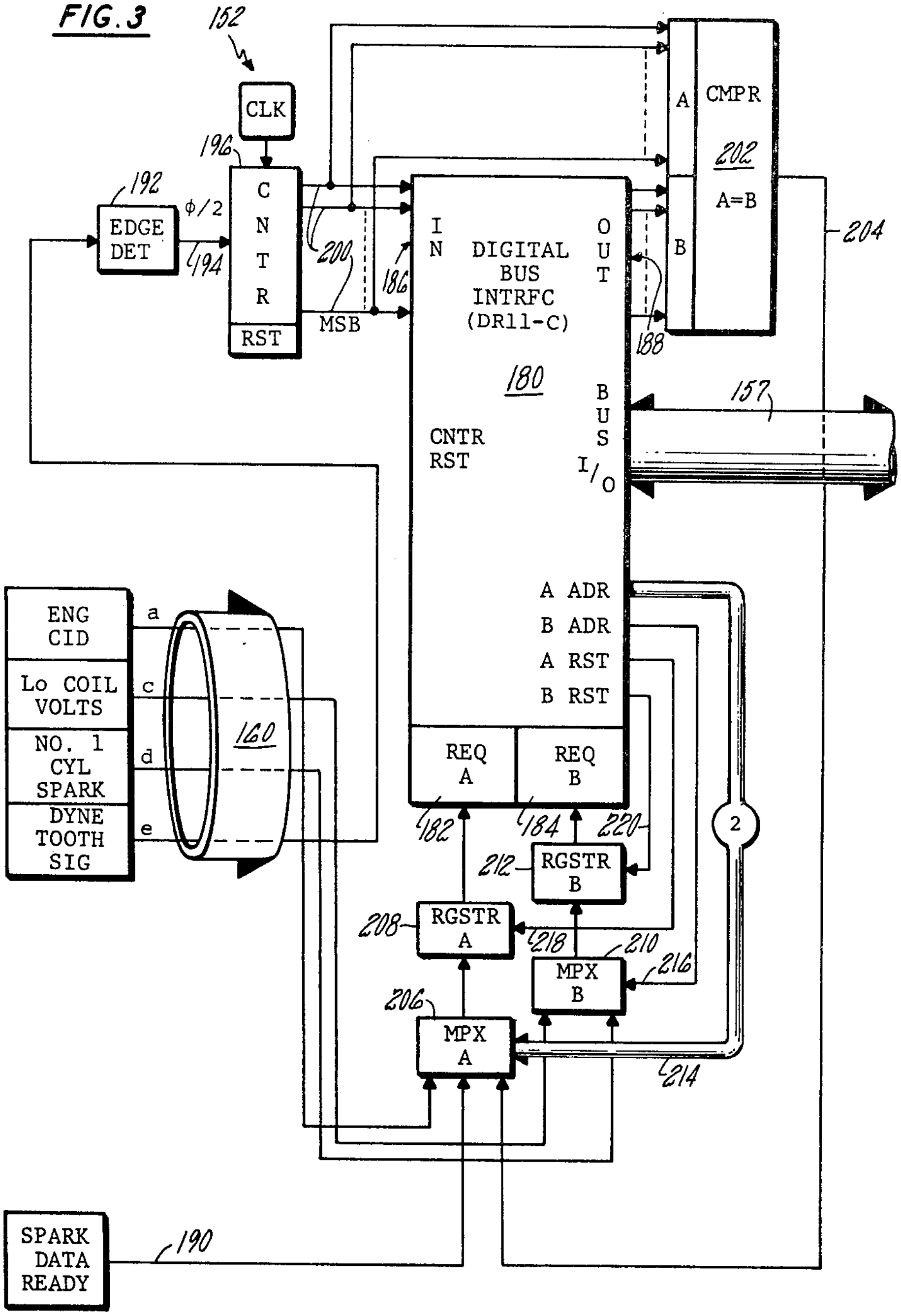
FIG. 3 is a system block diagram illustration of one subsystem as may be used in the control system embodiment of FIG. 2.

Referring now to FIG. 3, the interface 152 includes a general purpose, parallel in/out bus interface 180, such as the DEC DR11-C, which interfaces the processor bus 134 to the signal conditioning circuitry illustrated. As known, the DR11-C includes a control status register, and input and output buffer registers, and provides three functions including: (1) address selection logic for detecting interface selection by the CPU, the register to be used, and whether an input or output transfer is to be performed, and (2) control logic which permits the interface to gain bus control (issue a bus request) and perform program interrupts to specific vector addresses. The interrupts are serviced at two inputs of the bus interface; REQ A input 182, and REQ B input 184. Each input responds to a discrete presented to the input and, in the presence of such a discrete, generates the bus request and interrupt to the CPU over the bus I/O line 157. The interface also includes 16 pin user input and output connections 186, 188 for data transfer between the signal conditioning circuitry and the processor.

The interface 152 receives: the engine CI, the Lo-Coil signal, the number one cylinder spark ignition signal, and the dyne raw tooth signal on lines 160 from the digital interconnect 54, and the SPARK DATA READY signal on a line 190 from the interface 154. The dyne tooth signal is presented to an edge detection circuitry 192 which detects the rising and falling edges of each raw dyne tooth pulse and provides a signal pulse for each, resulting in a doubling of the frequency, i.e., X 2 pulse count for each camshaft cycle (engine cycle). The conditioned dyne tooth signal is presented on an output line 194 as a series pulse signal at a frequency twice that of the raw tooth signal. For a dyne tooth count of 256 teeth the conditioned tooth signal provides 512 pulses per crankshaft revolution; each pulse-to-pulse interval defines a crankshaft angle increment equal to 360°/512, or 0.703°. Since each camshaft cycle is equal to two crankshaft revolutions, or 720°, the camshaft angle measurement revolution provided by the conditioned tooth signal is better than 0.1%.

The conditioned dyne tooth signal on the line 194 is presented to a ten bit counter 196 which counts the conditioned tooth signal pulses and provides a 10 bit binary count on lines 200 to the input 186 of the digital interface 180. The counter 196 provides a continuous count of the tooth pulses, continuously overflowing and starting a new 10-bit count. The count output from the counter 196 is also presented to one input (A) of a comparator 202 which receives at a second input (B) a 10-bit signal from the user output 188. The comparator provides a signal discrete on an output line 204 in response to the condition A=B.

The CI signal, the SPARK DATA READY signal, and the output of the comparator 202 on the line 204, are presented to the input of a multiplexer (MPX) 206, the output of which is presented to a buffer register 208. The Lo-coil voltage signal and the number one cylinder spark signal are each presented to a second MPX 210, the output of which is connected to a second buffer register 212. The outputs of the registers 208, 212 are connected to the interrupt inputs 182, 184 of the bus interface. The signal select function provided by the MPX's 206, 210 is controlled by address signals from the CPU on the bus interface output lines 214, 216. The address signals select the inputs called for by the CPU depending on the particular test routine or engine condition to be monitored at the particular time. The interface 180 also provides reset discretes for the registers 208, 212 on lines 218, 220 following the receipt of the buffered discrete at the interrupt inputs.

In operation, the control system acquires camshaft synchronization by having the CPU provide a SELECT CI address signal on lines 214 to the MPX 206. The next appearing CI signal is steered into the register 208 and read at the input 182. The interface generates a bus request and an interrupt back through the data bus to the CPU, which when ready, responds to the interrupt by reading the counter output on the lines 200. The count value is stored in data common. The CPU processes a number of CI interrupts, each time reading the counter output. The ten bit counter provides alternating high and low counts on successive CI interrupts, corresponding to TDC of the power stroke and intake stroke of each engine cycle. Typically, the count samples at alternate interrupts are averaged to provide two average count signals corresponding to the two interrupts in each cycle. The CPU next requests the number one cylinder spark discrete by outputting a READ NO. 1 SPARK address signal on the line 216 to the MPX 210. In response to each spark signal interrupt, the CPU reads the output of the counter 196. Since the spark discrete signal appears only once in each engine cycle, as opposed to the twice appearing CI signal, the count corresponding to the spark discrete is compared to the two averaged count signals for the CI interrupt. The CI count closest to that of the spark count is selected as the CI corresponding to the number one cylinder power stroke. The CI sensor crankshaft angle displacement from true TDC is read from memory and the equivalent angle count is added to the selected CI count ($CI_p$) to provide the crankshaft synch point count which is stored in memory. The difference count between the spark count and synch point count represents the engine timing angle value, which is also stored in memory. The subroutines for camshaft synchronization are described hereinafter with respect to FIG. 7.

With the engine cam cycle defined by the stored count in memory the CPU may specify particular camshaft angles at which it desires to read some of the engine sensed parameters. This is provided by reading the desired cam angle value from the memory 136 to the output 188 of the interface 180, i.e., the B input of the comparator 202. In response to the count on the lines 200 from the counter 196 being equal to the referenced count, the comparator provides a discrete to the MPX 206, which is addressed to the comparator output by the appropriate "SELECT COMPARATOR" address on the lines 214. This interrupt is serviced in the same way providing a vectored address to the CPU and steering it to the particular one of the analog input channels.

Figure 4:
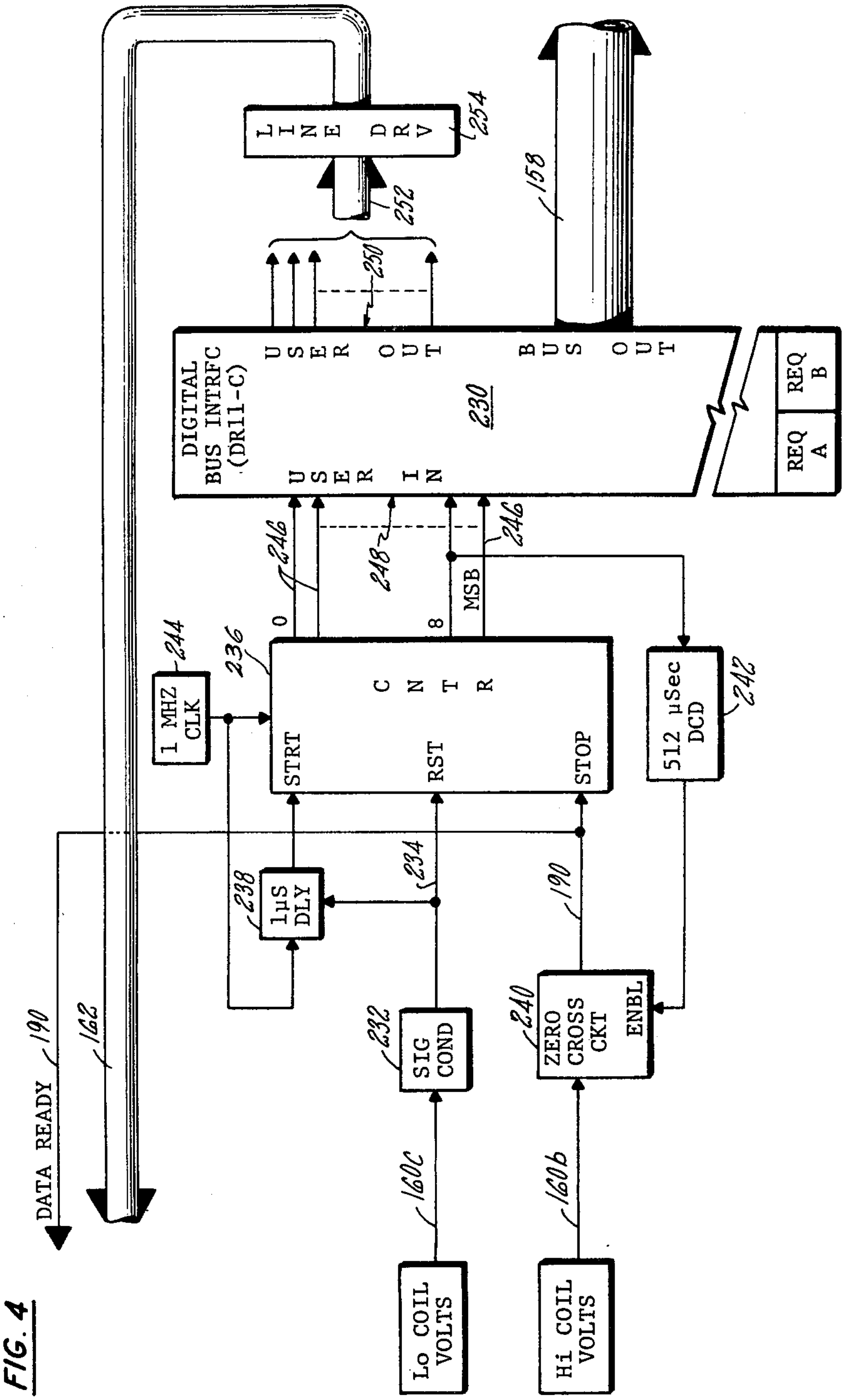
FIG. 4 is a system block diagram illustration of another subsystem as may be used in the control system embodiment of FIG. 2.

Referring now to FIG. 4, the digital interface 154 also includes a digital bus interface 230, such as a DR11-C. The interface 154 receives the sensed engine discrete signals including the Hi-coil and Lo-coil voltage signals on lines 160. The Lo-coil signal is presented to signal conditioning circuitry 232 which squares up the leading edge of the signal and provides the conditioned signal on a line 234 to the reset (RST) input of a twelve bit counter 236 and to the enable (ENBL) input of a one-shot monostable 238. The Hi-coil signal is presented to a zero crossover circuit 240 which when enabled provides the SPARK DATA READY signal on the line 190 in response to the presence of a zero amplitude, i.e., crossover of the Hi-coil signal.

As described hereinafter with respect to the sparkplug load tests, each Hi-coil voltage signal which is representative of successive sparkplug voltage signals includes an initial KV peak voltage followed by a plateau representative of the actual plug firing interval. The peak KV portion is followed by a ringing of the waveform which, on some instances, may be detected by the zero crossover circuit as a true crossover, therefore, the crossover circuit is enabled only after a selected time interval following the leading edge of the Lo-coil signal. The enable is provided by a decode circuit 242 which senses the output of the counter 236 and in response to a count greater than that corresponding to a selected time interval, typically 512 microseconds, provides an enable gate to the zero crossover circuit. The SPARK DATA READY discrete from the zero crossover circuit is provided both to the input of the digital interface 152 and to a stop (STP) input of the counter 236. A one megahertz signal from a clock 244 is presented to the count input of the counter 236 and to the input of the monostable 238, the output of which is presented to the start (STRT) input of the counter.

The counter functions as an interval timer and provides an indication of the time interval between the Lo-coil leading edge and the Hi-coil zero crossover which corresponds to the time duration of the sparkplug voltage signal. In operation, the leading edge of the conditioned Lo-coil signal resets the counter and triggers the monostable which, following a prescribed delay (typically one clock period) starts the counter which then counts the one megahertz clock pulses. In response to a lines 246 count greater than 512, the decode 242 provides the enable to the zero crossover circuit. At the Hi-coil crossover, the crossover circuit provides the SPARK DATA READY discrete on the line 190, which stops the counter and if selected by the CPU, interrupts the CPU via the digital interface 152. The interrupt causes the CPU to read the count at input 248 of the bus interface as an indication of the time duration of the sparkplug firing voltage. Typically, this sparkplug duration count is read continuously by the CPU, which with the synchronization to the camshaft angle identifies each sparkplug signal with its associated cylinder.

The bus interface 230 also provides at a user output 250 the digital discrete signals corresponding to the START ENGINE signal, and the discrete signals associated with the throttle actuator (56, FIG. 1) and with control of the emissions analyzer (70 FIG. 1). These discrete enable signals to the analyzer include flush, sample, drain, and sample intake commands which cause the analyzer to function in a program, all of which is known in the art. All of the discretes are presented through output lines 252 to line drivers 254, the output of which is presented through the lines 162 to the digital interconnect 54.

Figure 5:
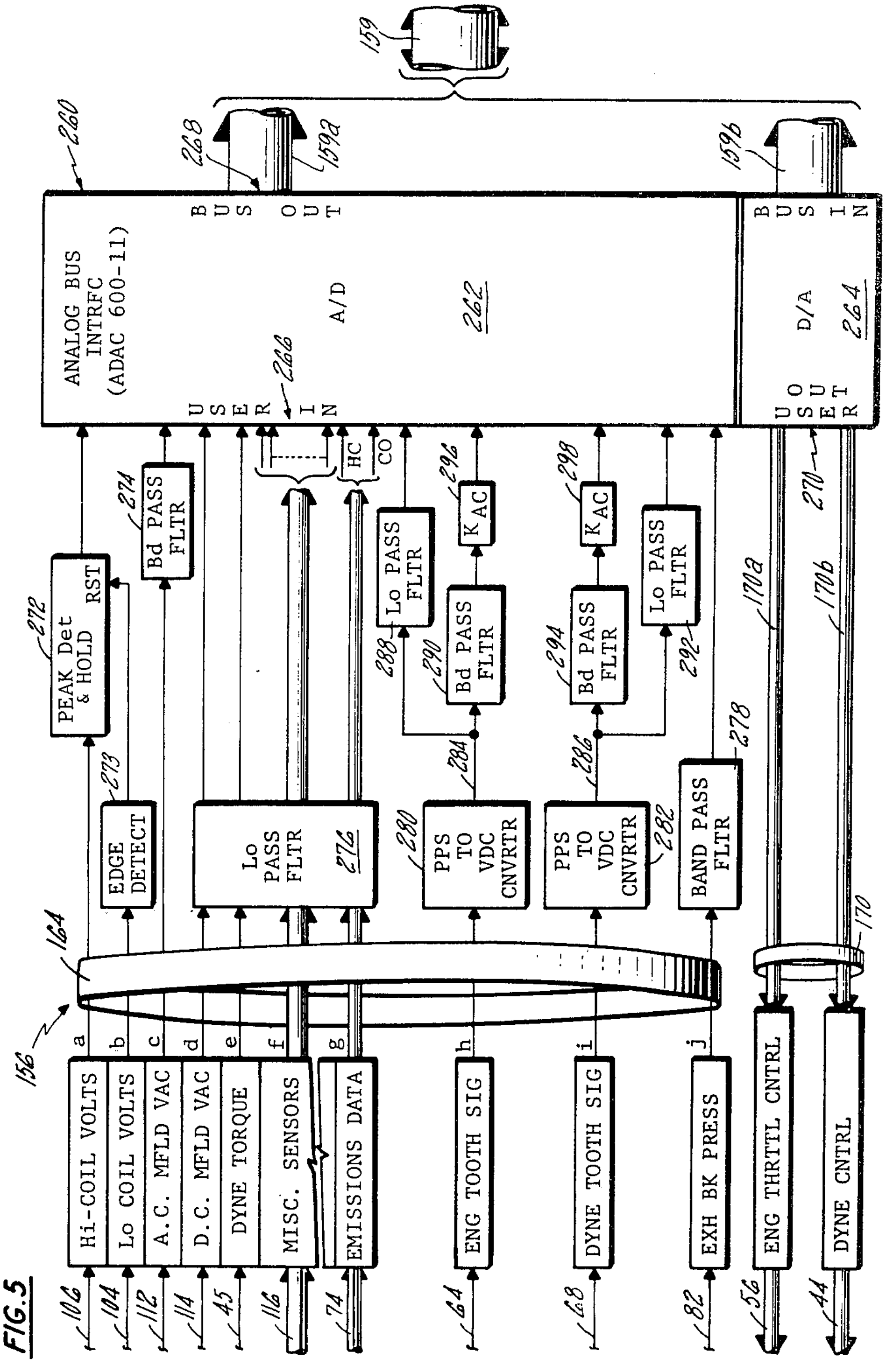
FIG. 5 is a system block diagram illustration of still another subsystem as may be used in the control system embodiment of FIG. 2.

Referring now to FIG. 5, the analog interface 156 includes an analog bus interface 260, such as the DEC model ADAC600-11, having input/output sections 262, 264. The input section includes a series of data acquisition channels connected to a user input 266, and an analog-to-digital (A/D) converter for providing the digital binary equivalent of each sensed analog parameter through the bus output 268 and lines 159*a* to the processor bus. The output section includes a digital-to-analog (D/A) converter which receives the CPU output signals to the engine on lines 159*b* and provides the analog signal equivalent of each at a user output 270. The CPU output signals include: the setpoint reference signals for the engine throttle control and the torque setpoint reference signal for the dyne control all included within the lines 170 to the analog interconnect.

The sensed engine signals presented to the analog interface are signal conditioned prior to input to the bus interface. The Hi-coil voltage signal on line $164_a$ is presented to a peak detector 272 which samples and holds the peak KV value of the signal, and this sampled peak value is presented to the bus interface. The peak detector is resetable by an engine event discrete, such as the trailing edge of low coil from the Lo-coil signal conditioner 273 in the interface 156. The AC manifold signal is presented through a band pass filter 274 to the bus interface. The limits of the band pass filter are selected in dependence on the number of engine cylinders and the range of engine test speeds. The DC manifold vacuum signal, the dyne torque signal, the miscellaneous sensed signals including engine oil, water and fuel temperatures and pressures, and the emissions data (lines $164_{d-g}$) are coupled to the bus interface through low pass filters 276 which reject any spurious noise interference on the signal lines. The exhaust back-pressure sense signal on a line $164_j$ is presented to a band pass filter 278 prior to presentation to the bus interface, with the limits selected based on the particular engine and speed range.

The engine raw tooth signal and the dyne raw tooth signal on the lines $164_{h,i}$ are presented to associated frequency to DC converters 280, 282. The output signals from the converters, which include DC and AC components of the tooth signals, are provided on lines 284, 286 to associated band-pass and low-pass filters. The converted engine tooth signal is presented to low pass filter 288 and band-pass filter 290, and the converted dyne tooth signal is presented to low-pass filter 292 and band-pass filter 294. The DC signals from the low-pass filters 288, 292 provide the DC, or average engine speed ($N_{av}$) for the engine and load, and are presented directly to the bus interface. The AC signal outputs from the band-pass filters, whose limits are selected based on the same considerations given for filters 274, 278, are presented through AC amplifiers 296, 298 to the associated channels of the input interface 262 as the indications of the instantaneous, or AC speed (N) of engine and load.

Figure 6:
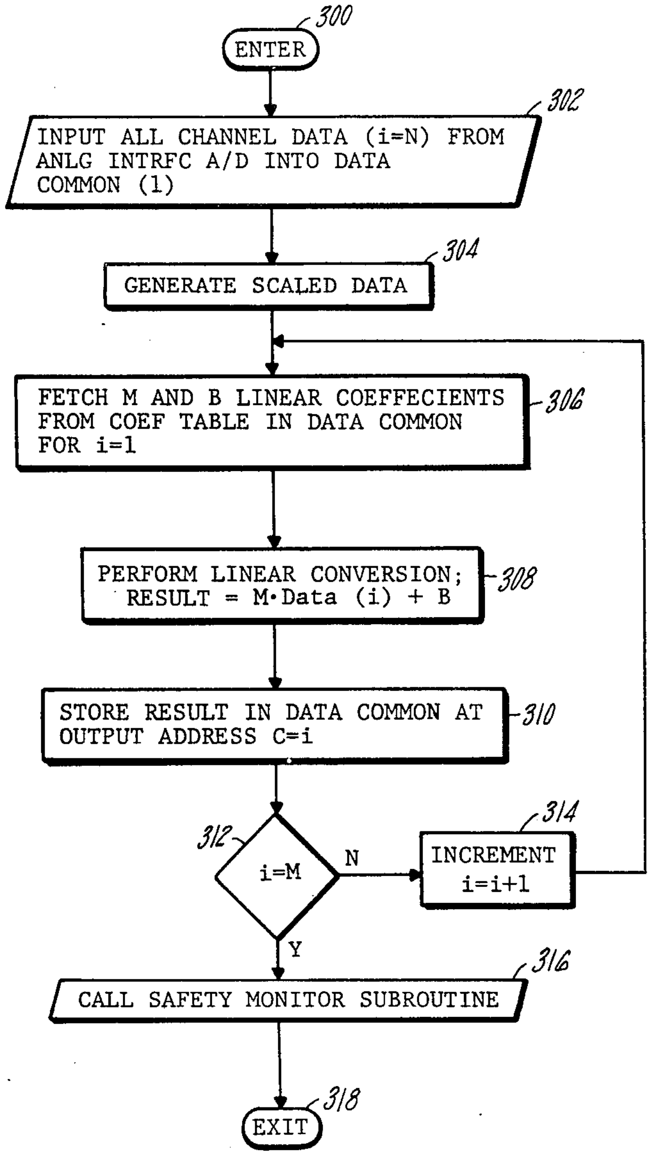
FIG. 6 is a simplified logic flowchart diagram illustrating one functional aspect of the control system of FIG. 2.

As described hereinbefore, the general data acquisition routine collects the data from the analog bus interface 260 at a prescribed sample cycle, typically once per second. The raw data is stored in one section of the data common partition of the memory 136 and a data acquisition subroutine generates a set of scaled data from the raw data using linear conversion coefficients stored in a coefficient table in memory. This second set of data is a properly scaled set of floating point numbers and is used primarily by the dynamic data display programs (for display on the CRT, FIG. 2) and for particular test subroutines which require slow speed data). In addition, the general data acquisition routine may also execute a safety monitor subroutine which checks for overtemperature of the engine block and also low engine pressure limits. Referring now to FIG. 6, in a simplified flow chart illustration of the general data acquisition routine the CPU enters the flow chart following terminal interrupt 300 and executes the subroutine 302 which requires the sampling of all A/D data channels (i=N) from the analog bus interface (260, FIG. 5). The raw data read from the A/D is stored in data common. Following the raw data acquisition subroutine 304 calls for providing a scaled set of data from that sampled in 302. This begins with process 306 which requests the CPU to fetch the linear coefficients (M,B) associated with the particular data channel (i=N) from a coefficient table in data common. Process 308 request the linear conversion of the raw data to the scaled result, after which instructions 310 call for storage of the scaled data in data common at an address C=i. Decision 312 determines if the last conversion was also the last channel (i=N) and if NO then instructions 314 requests an increment of the CPU address counter to the next address and the conversion subroutine is again repeated for each of the raw data values. Following the completion of the linear conversion subroutines (YES to decision 312) the safety monitor subroutine 316 is executed.

Figure 7A:
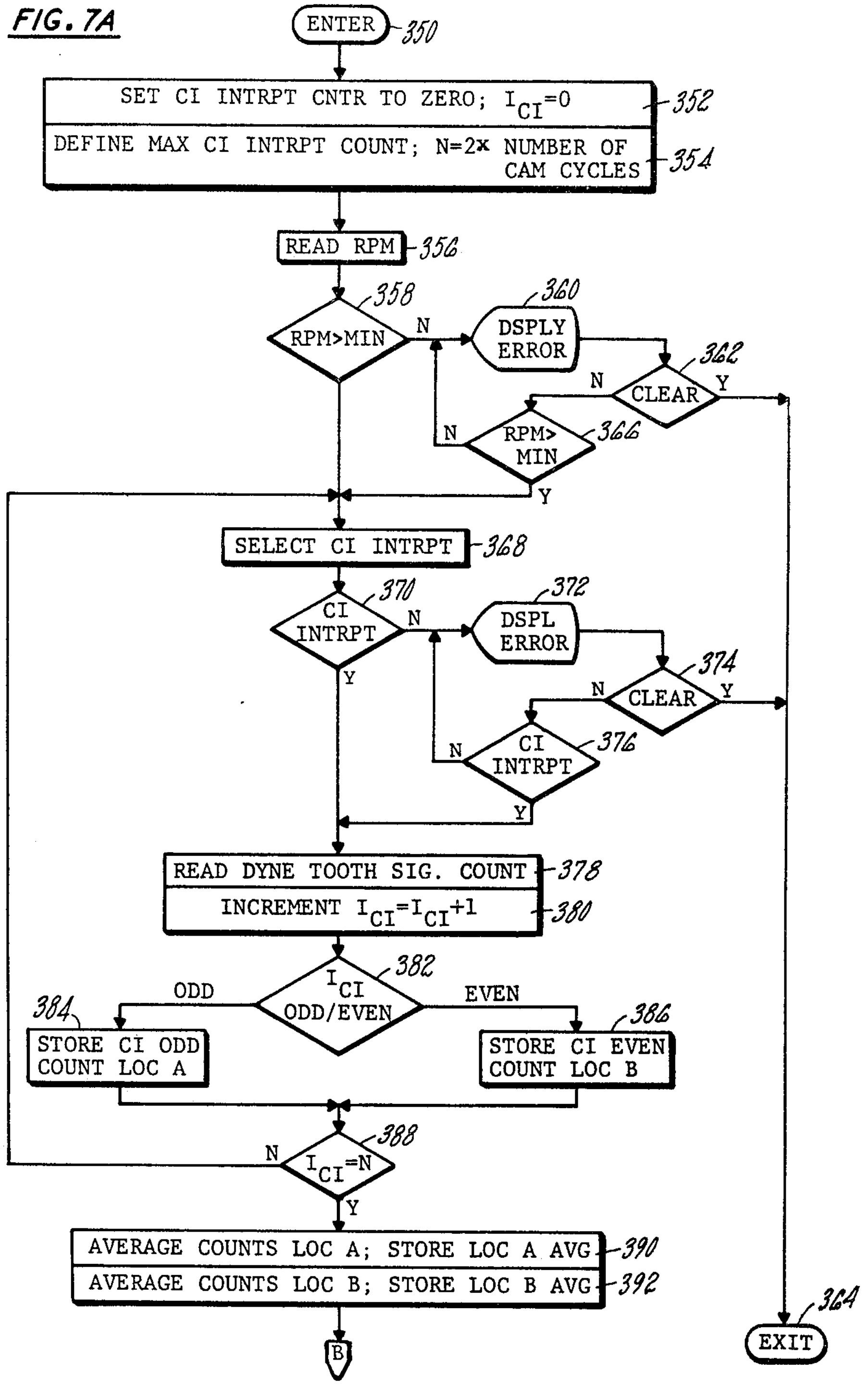
FIG. 7 A and B taken together are a simplified logic flowchart diagram illustrating one function of the present invention as performed by the control system of FIG. 2.

All of the engine test routines acquire initial value data relating to load speed and torque as well as engine timing and crankshaft synchronization prior to taking the particular test routine engine data. The analog values relating to load speed and torque are obtained under the general acquisition routine. The engine timing and crankshaft synchronization is obtained under a separate subroutine. Referring now to FIG. 7, which is a simplified flowchart illustration of a preferred engine timing and synchronization subroutine, the CPU enters the subroutine at 350 (FIG. 7A) and instructions 352 request the CPU to set the crankshaft index (CI) interrupt counter at zero. Instructions 354 request a max. CI interrupt count of N which is equal to twice the number of desired cam cycles of data (M) since the crankshaft index sensor (90, FIG. 1) provides two pulses in each cam cycle. Instructions 356 next request the read of average engine RPM from data common. Decision 358 determines if the actual engine speed is above a minimum speed required to insure valid data. If NO, instructions 360 display an error on the CRT, (144, FIG. 2) followed by decision 362 which determines if an operator entered CLEAR has been made. If there is a CLEAR of the test when the CPU exits the subroutine at 364. In the absence of an operator CLEAR the CPU waits in a loop for the minimum speed condition to be established. This is provided by decision 366 which determines if the latest RPM is greater than minimum, and if NO then continues to display the error and look for a CLEAR in 360, 362. Once the minimum RPM has been exceeded, instructions 368 request the CPU to select CI INTRPT which results in the address select to the MPX 206 of the digital interface 152 (FIG. 3) which monitors the CI pulse signal provided on a line $160_a$.

Decision 370 monitors the CI interrupt and in the absence of an interrupt displays an error in instructions 372, and looks for an operator CLEAR in instructions 374. If a CLEAR is entered the CPU exits at 364, and if no CLEAR then decision 376 monitors the presence of a CI interrupt. Following a CI interrupt instruction 378 requests a read of the dyne tooth signal count provided by the counter 196 (FIG. 3). The CPU increments the interrupt counter in instructions 380 to mark the dyne tooth count and decision 382 determines if the present interrupt is odd or even. If odd the count is stored at location A and if even it is stored at location B (instructions 384, 386). Decision 388 next determines if the interrupt is at the max count N and if not then branches back to instructions 368 to set up the next CI interrupt data acquisition. If the maximum number of interrupts have been serviced instructions 390 and 392 request the averaging of all the stored count data in each of the locations A, B to provide an average A count and an average B count.

Figure 7B:
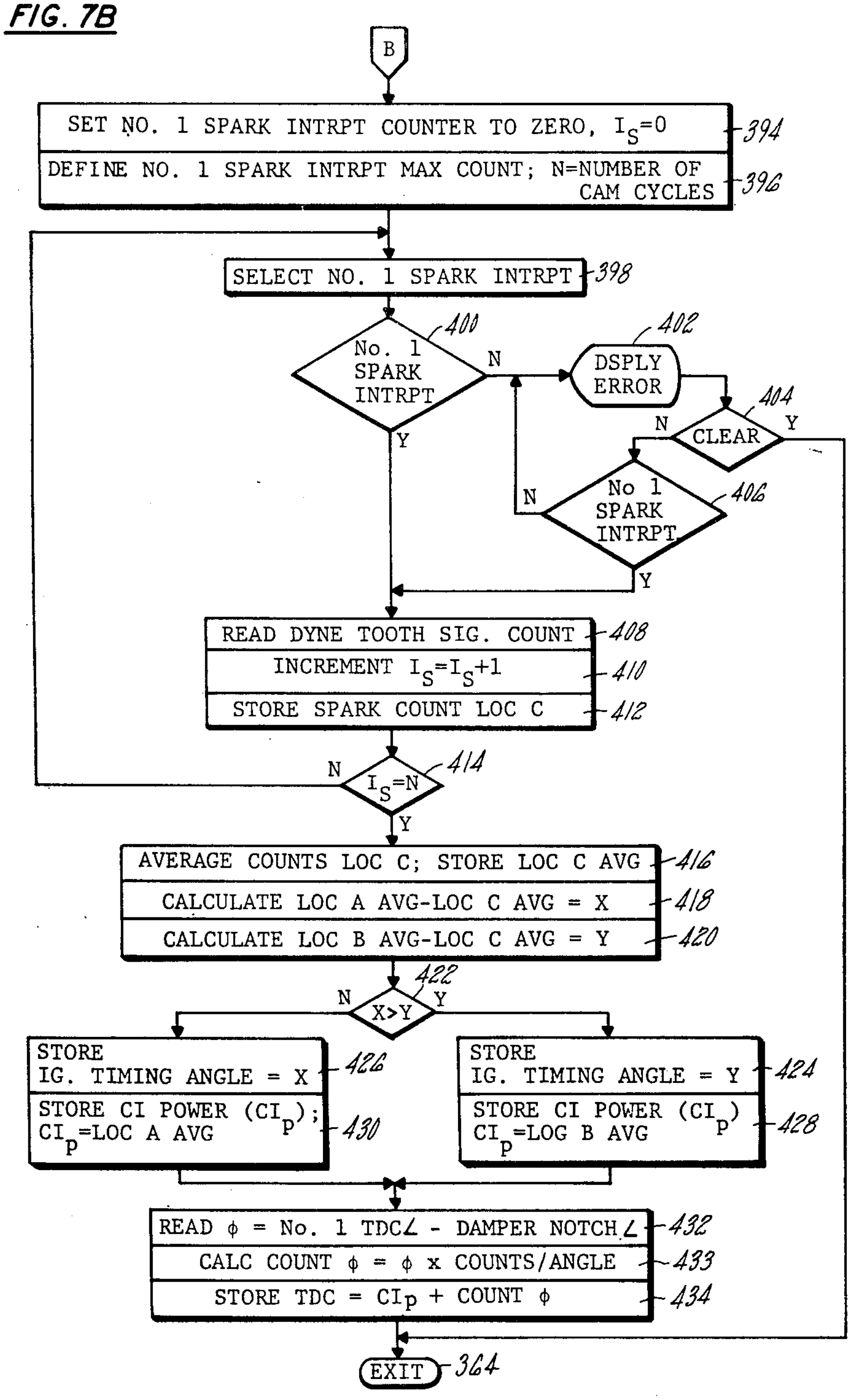

The CPU must identify which of the two interrupts occurring within the cam cycle is associated with the TDC of the #1 cylinder power stroke. This is provided by an acquiring the cam angle data associated with #1 cylinder spark ignition. In FIG. 7B, instructions 394 set the #1 spark interrupt to zero and instructions 396 define the max spark interrupt count as M equal to the number of cam cycles of data to be acquired. The CPU then executes the subroutine to determine the cam angle position corresponding to the #1 spark ignition. This begins with instructions 398 to select a NO 1 SPARK INTRPT. The decision 400 looks for the presence of a spark interrupt and if no interrupt appears within a predetermined time interval the CPU again goes into a waiting loop which begins with the display of an error in 402 and the monitoring of an operator entered CLEAR in decision 404. If an operator clears entered the CPU exits the subroutine at 364. If no CLEAR, then the presence of a spark interrupt is continuously monitored in instructions 406.

Following a spark interrupt, instructions 408 read the dyne tooth signal count. Instructions 410 increment the spark interrupt counter by one and instructions 412 call for the storage of the spark count value at location C. Decision 414 determines if this is the last spark interrupt to be serviced, and if not the CPU branches back to instructions 398 to set up for the next interrupt data read. Following the requested number of interrupts, instructions 416 request the averaging of all the count stored at location C to provide a C average count value.

With this information available, the CI interrupt associated with TDC of the power stroke can be determined by comparing the two CI counts (odd/even) to the spark interrupt count. This is provided in instructions 418 et seq which first calls for calculating the difference (X) between the average A and the average C counts. Instructions 420 request the determination of the count difference (Y) between the B average and the C average counts. Decision 422 compares the X and Y counts to determine which is the largest. If the X count is larger, than instructions 424 store the Y difference count as that representative of the engine timing angle value. Similarly, instructions 426 call for storing the X count as the engine timing angle if it is the smaller of the two count differences. Instructions 428, 430 request the CPU store of the crankshaft index power ($CI_p$) as being equal to the count of the B average, or the A average, respectively. In other words, the particular one of the two counts received in the CI interrupt closest to the count corresponding to the spark interrupt is then considered to be the $CI_p$ of #1 cylinder. Instructions 432 request the CPU to read the angle ($\phi$) defined by the engine manufacturer for the particular engine which represents the angular displacement between the mounting hole for the CI sensor in the damper housing and the instantaneous position of the damper notch at true TDC of #1 cylinder. Instructions 433 next request the equivalent count value associated with the displacement angle, and instructions 434 request the calculation of the cam cycle synchronization point, or true TDC of #1 cylinder power stroke, as the sum of the crankshaft index of the power stroke plus the count increment associated with the displacement angle. Following instructions 434, the CPU exits the program at 364.

With the CPU synchronization to the engine crankshaft, the sensed engine data at the analog interface 158 (FIG. 2) may be sensed at any selected crankshaft angle increment, down to the 0.7 degree resolution provided by the conditioned dyne tooth signal to the interface 152. The particular selection of angle increment depends on the resolution accuracy required of the measured data, or the frequency of data change with crankshaft angle. Typically, the selected angle increments may be three or four times greater than the achievable angle resolution, the limitation due primarily to the processor overhead time, i.e., the inability of the processor to gain access to and process the data within the equivalent real time interval associated with the 0.7 degree crank angle interval. In general, each test routine includes its own, dedicated data acquisition subroutine for the particular parameter of interest. The various tests read out the slower engine speed data from data common, as provided by the general data acquisition routine. This slower data includes, among others, the sensed miscellaneous sensors (115, FIG. 1) data relating to oil and water temperatures, the choke position, and the average speed and load torque values, as may be necessary to determine if the engine prequisite conditions have been established prior to test.

The description thus far has been of a hot-test installation and control system which is capable of providing a number of different automated tests for determining the performance of the test engine. The instrumentation described with respect to FIG. 1, and the control system of FIGS. 2-5 together with the description of the application software including the general data acquisition, are illustrative of that required for a hot-test system capable of providing such a number of different performance tests. The present invention may be incorporated in such a system; its use and implementation in such a system, as described in detail hereinafter, represents the best mode for carrying out the invention. It should be understood, however, that the invention may be implemented in a simpler system which includes the engine load, but which includes only that sensing, signal conditioning, and signal processing apparatus required for direct support of the invention.

The present invention provides a quantitative test for evaluating the performance of the secondary ignition system of an IC engine at an off-idle, loaded condition. The test provides for measurement of the peak KV magnitude and the time duration of the spark voltage signal provided for each engine cylinder sparkplug. The sparkplug voltage measurements are made by measuring the instantaneous values of the ignition coil secondary voltage to detect the presence and magnitude of a peak KV signal together with the crankshaft angle at which it occurs, in addition to the time interval of the spark duration. With synchronization of the CPU to the engine crankshaft, a synchronization point is established (FIG. 7) such that the nominal position of the power stroke TDC position of each cylinder within the cam cycle is predicted. The ignition coil secondary spark voltage signals are then correlated with a particular engine cylinder by comparison of the crankshaft angle value at which each signal is detected with the predicted cylinder TDC crankshaft angle values. This permits evaluation of the secondary ignition system itself in addition to providing information on specific cylinder ignition faults. The invention may be used alone, or together with other test procedures in a hot-test system as described with respect to FIGS. 1 through 5.

Figure 8:
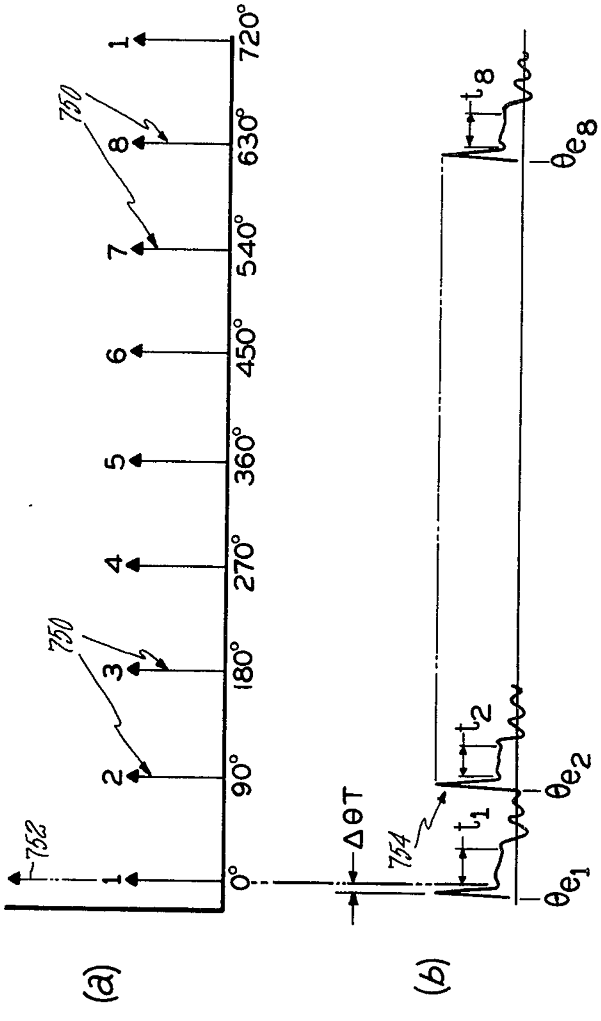
FIG. 8 is an illustration of a set of waveforms characterizing the dynamic ignition conditions of an IC engine, which is used in the description of the present invention.

Referring now to FIG. 8, illustration (a) represents one engine cam cycle for a 4-cycle, 8-cylinder engine. The cam cycle is equal to two crankshaft revolutions, or 720°. The vectors 750 represent the TDC position of the engine cylinder power strokes as they appear at 90° crankshaft angle intervals within the cam cycle. The cylinders are numbered 1 through 8 corresponding to their position in the engine firing order from the synchronization point 752 obtained by the CPU in crankshaft synchronization subroutine of FIG. 7. The numbers have no relationship to the cylinder locations or identification in the engine block itself. With the synchronization point identified the control system maps the full cam cycle with the nominally anticipated power stroke TDC positions of each cylinder.

With the map of anticipated cam cycle TDC positions, the CPU acquires the peak KV voltage values and spark duration data using the interrupt mode. The digital interface 52 (FIG. 3) provides a CPU interrupt at the leading edge of each Lo-coil (ignition coil primary) voltage signal together with the vectored address directing the CPU to read the measured peak value at the input channel of the analog bus interface 260 connected to the peak detector circuit 272 (FIG. 5). The digital interface 152 also interrupts the CPU in the presence of the SPARK DATA READY discrete on line 190 from the interface 153 (FIG. 4) which provides the discrete at the zero crossover of the secondary voltage waveform, described in detail hereinbefore. The CPU responds to the data ready discrete which includes a vectored address causing the CPU to read the output of the interval timer, i.e. the counter 236 at the digital bus interface 230 (FIG. 4). As described hereinbefore, the interval counter provides the time interval beginning within one microsecond of the Lo-coil leading edge which indicates the availability of secondary coil voltage. At the peak KV interrupt the CPU also reads the count output from counter 196 included in the interface 152 of FIG. 3 to obtain the equivalent crankshaft angle value at which the peak KV pulse appears. This information together with the engine timing information obtained in the CPU to crankshaft synchronization routine of FIG. 7, allows correlation of the particular sensed spark voltage signal with an associated one of the engine cylinders, as described hereinafter with respect to the flowchart of FIG. 9.

As described hereinbefore with respect to FIG. 1, the Lo-coil voltage signal is sensed with the connection 102 to the ignition coil primary and the Lo-coil signal leading edge is used for providing the CPU interrupt marking the beginning of each spark voltage signal. The Hi-coil voltage signal is sensed with the KV probe 103 and the sensed signal is presented on line 106 to the peak detector (272, FIG. 5) which detects the peak KV value, and to the zero crossover circuit (240, FIG. 4) which together with the interval timer circuitry provides the spark duration information. In FIG. 8, illustration (b) the waveform 754 represents a typical set of sparkplug voltage signals as they appear along the cam cycle of illustration (a). By sensing the crankshaft angle ($\theta_{e1}$–$\theta_{e8}$) for successive peak KV values ($P_1$ through $P_8$) the sensed peak values are identified with the TDC positions of the associated cylinders by adding the timing value ($\Delta\theta_T$) acquired in the routine of FIG. 7 to each sensed angle value. By comparing the resultant angle value with each TDC value from the mapped cam cycle, the association of spark voltage signal to cylinder may be made.

Figure 9:
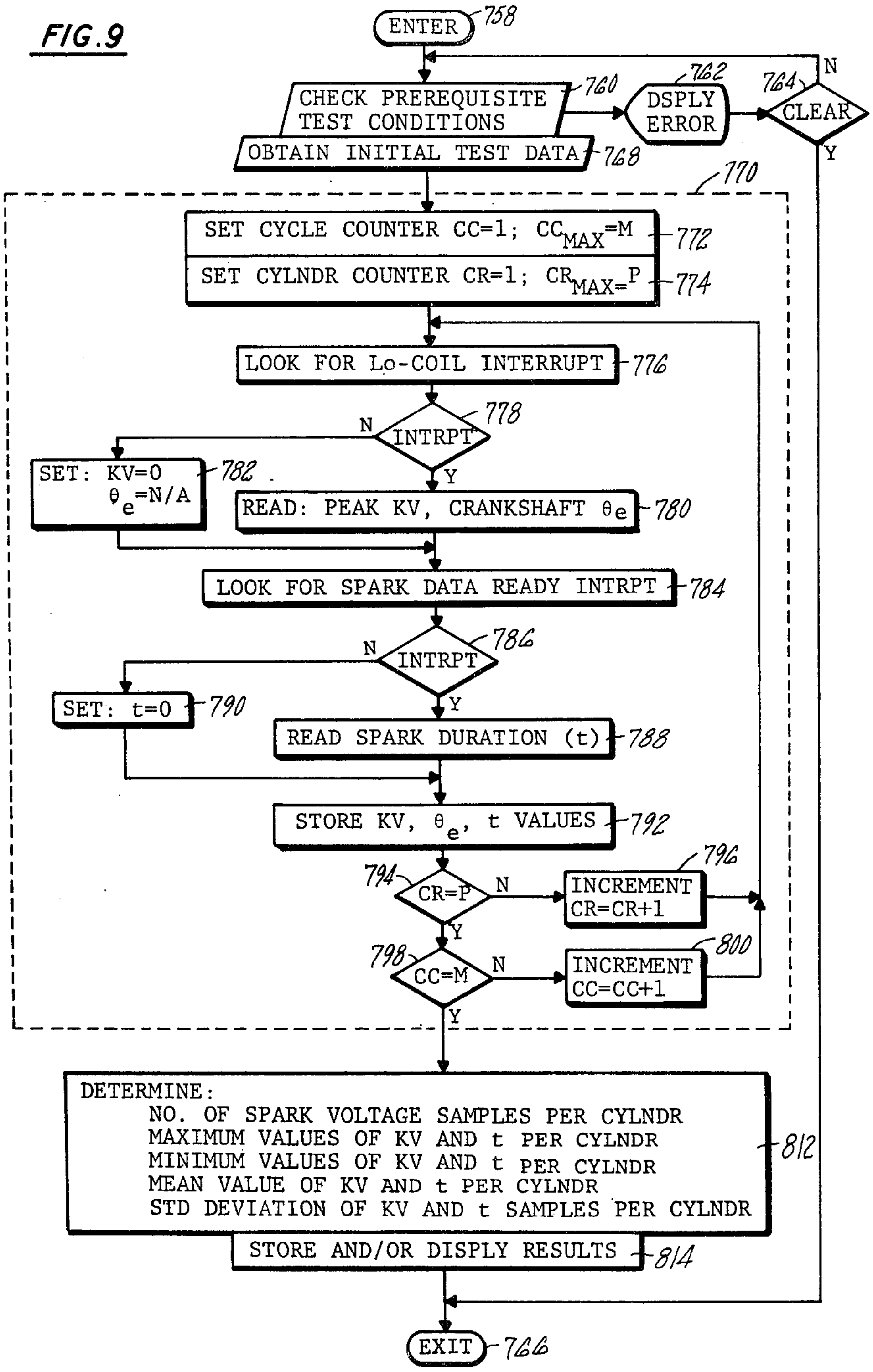
FIG. 9 is a simplified logic flowchart diagram illustrating the sparkplug load test of the present invention, as performed in the control system of FIG. 2.

Referring now to FIG. 9 in a simplified flowchart illustration of the sparkplug load test of the present invention, as used in the control system of FIG. 2, the CPU enters the flowchart at 758, and executes subroutine 760 to determine if the prerequisite engine test conditions have been established. The prerequisite conditions verify the load torque setting, the thermostat control of the engine, and the engine test speed value. Thermostat control is verified by sensing the coolant and oil temperatures from the miscellaneous engine sensors (115, FIG. 1). The measurement of actual engine speed and load torque ensure that each are stable within a selected tolerance band around the setpoint values of speed and load provided by the control system through the analog interconnect to the throttle and dyne controls (55, 42, FIG. 1); the selected test speed and load torque values being read out of the test plan in memory. The selected speed and load torque values are dependent on the particular type and model engine, and in general are selected to ensure smooth running of the engine so as to allow for repeatable peak KV and time duration data from cycle to cycle. The repeatability of the spark peak KV and time duration values is affected by the fuel mixture provided to each cylinder. As a rule, the richer the fuel mixture to the cylinder the lower the KV peak amplitude and the longer the time duration of the spark voltage signal to the cylinder. Conversely a leaner fuel mixture results in a higher KV and shorter spark duration. Since it is preferred to obtain the spark signal data for each cylinder over some number (M) of cam cycles, the fuel mixture should be maintained relatively constant over the sampled cam cycles. For the assumed 8-cylinder engine a typical engine speed of 1200 RPM and load torque of 75 Ft-Lb is selected. Once again the actual values are engine dependent and must be established for each engine type.

If in the subroutine 760 any one of the prerequisite conditions has not been achieved, instructions 762 display an error on the CRT (144, FIG. 2) and decision 764 determines whether or not an operator-entered CLEAR has been made. If YES the CPU exits at 766. If NO then the CPU branches back to instructions 760 to again check if the fault, or missing condition has been corrected. Subroutine 768 obtains initial test condition parameters relating to the engine speed, load torque and timing value (obtained from FIG. 7). The speed and torque values are recorded to provide future correlation of the spark load test results with the actual engine conditions at the time of measurement. As such, they are required only for correlation and do not, themselves, provide spark load information. The timing value is used together with the angle values at which the peak KV signals were sensed to provide correlation of each peak KV value with its associated cylinder. Once again the timing is not an absolute requirement since correlation may be made from the raw data as sensed. It is preferred, however, to further ensure accurate correlation.

The CPU next executes the spark data acquisition routine 770, which in a simplified illustration begins with instruction 772 which request the setting of the cam cycle counter to a one count (CC=1) indicating the first cam cycle set of data values. The maximum count (CC Max) is equal to the total number of cam cycles of spark data to be obtained (M). Instructions 774 similarly set the cylinder counter to a one count (CR-1) with the max cylinder count being equal to P number of cylinders. Following the setting of both counters instructions 776 request the CPU to look for a Lo-coil interrupt after which decision 778 determines whether or not an interrupt is present. When an interrupt appears instructions 780 request the sampling of the peak KV voltage value and the crankshaft angle ($\theta$e value); the peak KV being read from the analog bus interface and the crankshaft angle from the conditioned dyne tooth count. If no interrupt appears in decision 778 within a preselected time interval, instruction 782 request the setting of a KV=0 entry with no angle value entry. Following instructions 780 or 782, instructions 784 look for a SPARK DATA READY interrupt from the interface 152. Decision 786 determines whether an interrupt is present and if YES instruction 788 requests the CPU read of the interval timer (digital interface 154). In the absence of a SPARK DATA READY interrupt instruction 790 request the CPU to set the time duration t=0. Following instructions 788, 790, instructions 792 request the storage of the KV, $\theta$e, and t values obtained. Decision 794 determines whether or not this is the last cylinder in the cam cycle, and if NO then instruction 796 increments the cylinder counter by one, after which the CPU branches back to instructions 776 to look for the next Lo-coil interrupt within the present cam cycle data set. If the answer to decision 794 is YES, decision 798 determines whether or not the last cam cycle of data has been obtained. If NO, instruction 800 increments the cycle counter by one after which the CPU branches back to instruction 774 to start the next data acquisition cycle. After the last cam cycle has been obtained, the CPU enters into the next subroutine.

Figure 10:
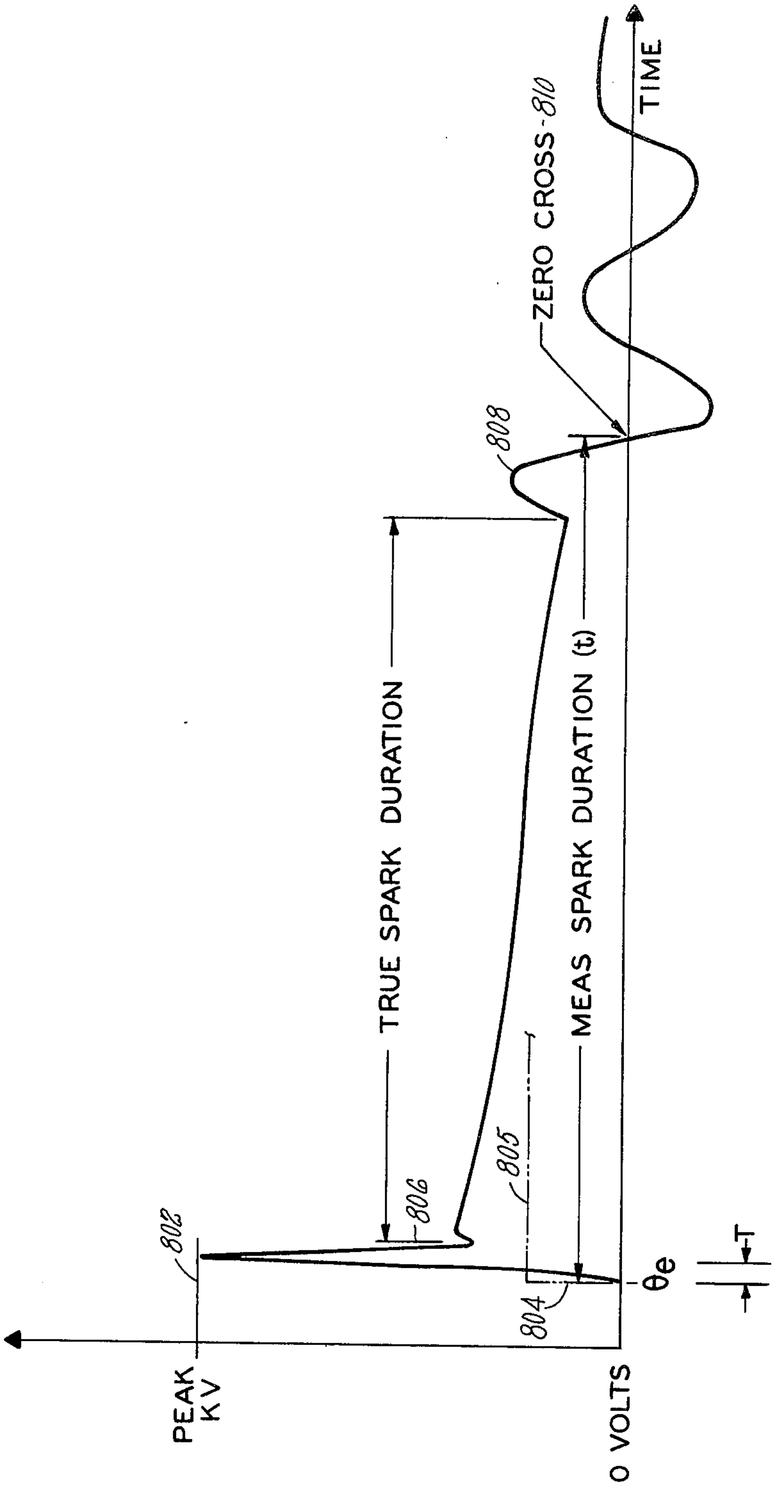
FIG. 10 is an illustration of a typical spark plug voltage waveform.

Referring now to FIG. 10 which illustrates a typical spark voltage waveform as measured at the secondary of the ignition coil. The waveform illustrates the peak KV pulse 802 which occurs at some time interval T following the presence of the leading edge 804 of the Lo-coil signal (shown in part by the phantom waveform 805). The time delay, typically one to two percent of the total spark duration interval, is due primarily to the ignition coil inductance and secondary resistance values which are essentially constant for a given engine model type. As such the error may be compensated to some extent for any particular engine. Since the CPU samples the peak KV angle value at the Lo-coil leading edge, the time delay from Lo-coil edge to peak KV does contribute to an error in the sense crankshaft angle value for the signal, however, since the sensed angle is used only to correlate the sensed peak KV with its associated cylinder the error is insignificant. The delay is compensated for by delaying the CPU read of the peak KV value by an equivalent T interval to allow the sample and hold detector to capture the peak value.

As illustrated the true spark duration, or plateau, of the spark voltage signal occurs between the trailing edge 806 of the peak KV pulse and the leading edge of the characteristic transient pulse 808 which occurs as a result of the closing of the ignition system points. As described hereinbefore with respect to the interface 153 (FIG. 4) the actual indication of the spark duration, i.e. the measured time duration, is that time interval corresponding to the time difference between the appearance of the leading edge 804 of Lo-coil and the occurrence of zero crossover 810 of the spark signal. The zero crossover is detected by the crossover circuit 240 which provides the SPARK DATA READY discrete in response to the detected zero crossover. Since the pulse width of the transient 808 is similarly dependent on the ignition coil inductance and secondary coil resistance, it is also essentially constant for a given engine model type. The error in measured duration resulting from the pulse width of the transient together with the max delay occurring between the leading edge of Lo-coil and peak KV is less than five percent. Once again both delays may be compensated to some extent with knowledge of the particular engine, such that the tolerance error may be significantly reduced.

Referring again to FIG. 9, following the data acquisition routine 770, subroutine 812 requests a number of calculations on the data obtained for each spark voltage signal and each of the (M) number of cam cycle data sets. This typically includes: the number of spark voltage signals appearing for each cylinder which in the absence of an intermittent fault should equal the number M of cam cycles of data; the determination of the maximum and minimum KV values obtained over the (M) number of cycles together with the mean value; and the maximum and minimum spark duration values together with a mean spark duration value for each. In addition, a measure of the standard deviation of the peak KV and time duration values obtained for the spark signal associated with each cylinder is provided as an indication of the relative ignition balance between the cylinders. The standard deviation information together with the statistical mean values provided for each cylinder spark pulse are useful in indicating any weak ignition conditions for any of the cylinders. Similarly, the acquisition of a number of cam cycles of data permits the detection of erratic, or intermittent ignition conditions in any one or more cylinders.

The results of the subroutine 812 are stored or displayed in subroutine 814. The typical format for displaying the information, both KV measurements and also spark duration, is a tabulation of the mean and standard deviation values for each cylinder, together with the actual number of samples of each cylinder's spark signal. This allows for the immediate comparison of the relative performance of each cylinder's ignition ability and also the ignition secondary system as a whole. Following the data storage the CPU exits the routine at 766.

The sparkplug load test of the present invention provides for the sub-cyclic measurement of both peak KV and time duration of each sparkplug voltage signal provided by the engine ignition system. The test provides for the relative indication of individual cylinder ignition efficiency and may be used to detect any one or more individual cylinder faults or to provide information from which a prognosis of the engine ignition system may be made. This permits the detection of not only existing faults but also provides information from which imminent faults may be detected and corrected, thereby further ensuring engine operation following installation in a vehicle. Similarly, although the engine has been shown and described with respect to a best mode embodiment thereof, it should be understood by those skilled in the art that the foregoing and various other changes, omissions and additions in the form and detail thereof may be made therein without departing from the spirit and scope of this invention.

We claim:

1. Apparatus for indicating the efficiency of the ignition system of an internal combustion (IC) engine connected at its crankshaft to the drive shaft of an engine load, the ignition circuitry providing secondary voltage signals as the spark plug voltage signal to each engine cylinder in each engine cycle, in the presence of associated ignition circuitry primary voltage signals, comprising:

first voltage sensing means for sensing the presence of each primary voltage signal and for providing a Lo-Coil voltage signal indicative thereof;

second voltage sensing means for sensing the actual magnitude of each secondary voltage signal and for providing a Hi-Coil voltage signal indicative thereof;

position sensing means, responsive to the interconnected engine crankshaft and load drive shaft, for providing engine crankshaft position signals indicative of the actual crankshaft angular position at successive crankshaft angle intervals in each engine cycle, said crankshaft angle intervals being less than that associated with a cylinder sub-cycle; and signal processing means, responsive to said Lo-Coil voltage signals, said Hi-Coil voltage signals, and said crankshaft position signals, and having memory means for storing signals including specification signals defining the required crankshaft position of each cylinder spark plug voltage signal in each engine cycle in terms of actual crankshaft angle value, for sampling, in response to each of said Lo-Coil voltage signals in a common engine cycle, and registering in said memory means, each of said Hi-Coil voltage signals and said crankshaft position signal appearing simultaneously therewith, and for providing ratio signals of the actual magnitude of each of said Hi-Coil voltage signals sampled in a common engine cycle divided by the average value of all of said Hi-Coil voltage signals sampled in the same engine cycle, said ratio signals providing in combination an indication of the relative spark efficiency of the engine.

2. The apparatus of claim 1, further comprising:

crankshaft index sensor means, disposed on the engine for providing a crankshaft synchronization signal manifesting the occurrence of a selected engine cycle event; and wherein said signal processing means is further responsive to said crankshaft synchronization signal, for providing, from said crankshaft synchronization signal and said specification signals in memory, cylinder position signals defining the actual crankshaft position of each cylinder spark plug voltage signal in terms of crankshaft angle interval values in each engine cycle, and for comparing the sampled values of said crankshaft position signal with said cylinder position signals, to identify each Hi-Coil voltage signal sample as being associated with one of the engine cylinders, whereby said ratio signal indications of relative spark efficiency are provided in terms of identified engine cylinders.

3. The method of indicating the efficiency of the ignition system of an internal combustion engine operating with a crankshaft connected engine load, the ignition system providing spark plug voltage signals to each cylinder in each engine cycle, comprising the steps of:

sensing the actual position of the engine crankshaft at successive crankshaft angle intervals in each engine cycle and providing crankshaft position signals indicative thereof, each crankshaft angle interval being less than that associated with a cylinder subcycle;

measuring together the actual magnitude of each spark plug voltage signal and the values of all of said crankshaft position signals appearing simultaneously therewith to provide, in each engine cycle, signals indicative of the actual magnitude of each spark plug voltage signal and signals indicative of the range of actual crankshaft angles associated with each;

ascribing each of said ranges of measured crankshaft angle values to a different cylinder spark ignition event in a common engine cycle; and comparing the actual magnitudes of the spark plug voltage signals ascribed to each cylinder ignition in a common engine cycle with the actual magnitudes of the spark plug voltage signals ascribed to all other cylinders in the same engine cycle, to provide the indication of ignition system efficiency.

4. The method of claim 3, wherein said step of comparing includes:

calculating the average magnitude of the spark plug voltage signals measured in a common engine cycle; and providing for each cylinder a signal ratio of the actual magnitude of the spark plug voltage signal ascribed to such cylinder's spark ignition event divided by said average magnitude of all spark plug voltage signals measured in said common engine cycle, whereby said ratio signals provide a relative indication of the ignition system efficiency.

5. The method of claim 4, further comprising the steps of:

determining the range of crankshaft angle values specified by the engine manufacturer as defining the required location of each cylinder's spark ignition in each engine cycle; and identifying each of said measured ranges of actual crankshaft angle values as associated with a particular one of said manufacturer specified ranges, so as to relate each of said measured spark plug voltage signals with an identified engine cylinder, whereby said ratio signal indications are each identified as associated with a particular engine cylinder.

* * * * *